United States Patent
Hofmann et al.

(10) Patent No.: US 6,782,031 B1
(45) Date of Patent: Aug. 24, 2004

(54) LONG-PULSE PULSE POWER SYSTEM FOR GAS DISCHARGE LASER

(75) Inventors: Thomas Hofmann, San Diego, CA (US); Bruce D. Johanson, San Marcos, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 09/451,995

(22) Filed: Nov. 30, 1999

Related U.S. Application Data

(63) Continuation-in-part of application No. 09/273,446, filed on Mar. 19, 1999.

(51) Int. Cl.[7] .............................. H01S 3/09; H01S 3/00
(52) U.S. Cl. ................... 372/90; 372/38.02; 372/38.04; 372/82
(58) Field of Search ............................ 372/38.02, 38.04, 372/82, 90

(56) References Cited

U.S. PATENT DOCUMENTS

| | | | |
|---|---|---|---|
| 4,698,518 A | 10/1987 | Pacala | 307/106 |
| 4,959,840 A | 9/1990 | Akins et al. | 372/57 |
| 5,142,166 A | 8/1992 | Birx | 307/419 |
| 5,309,462 A | 5/1994 | Taylor et al. | 372/38 |
| 5,313,481 A | 5/1994 | Cook et al. | 372/37 |
| 5,448,580 A | 9/1995 | Birx et al. | 372/38 |
| 5,729,562 A | 3/1998 | Birx et al. | 372/38 |
| 6,128,323 A | * 10/2000 | Myers et al. | 372/38.1 |

FOREIGN PATENT DOCUMENTS

WO    WO 99 60679 A    11/1999

OTHER PUBLICATIONS

Oh, J., et al., "Prototype 2-stage Magnetic Pulse Compression Modulator For Pulse Power Applications", International Power Modulator Symposium, US, New York, NY, IEEE, Jun. 25, 1996, pp. 186–189.

Hiroshi Tanaka, et al., "High-efficiency, all solid-state exciters for high-repetition-rate, high-power TEA CO2 lasers", Rev. Sci. Instrum. 61(8), Aug. 1990, pp. 2092–2096.

Deguchi, H. et al., "Efficient Design of Multistage Magnetic Pulse Compression", IEEE Journal of Quantum Electronics, vol. 30, Dec. (1994) No. 12, New York U.S.

* cited by examiner

*Primary Examiner*—Don Wong
*Assistant Examiner*—Cornelius H Jackson
(74) *Attorney, Agent, or Firm*—William Cray

(57) ABSTRACT

A long pulse power system for gas discharge lasers. The system includes a sustainer capacitor for accepting a charge from a high voltage pulse power source. A peaking capacitor with a capacitance value of less than half the sustainer capacitance provides the high voltage for the laser discharge.

17 Claims, 9 Drawing Sheets

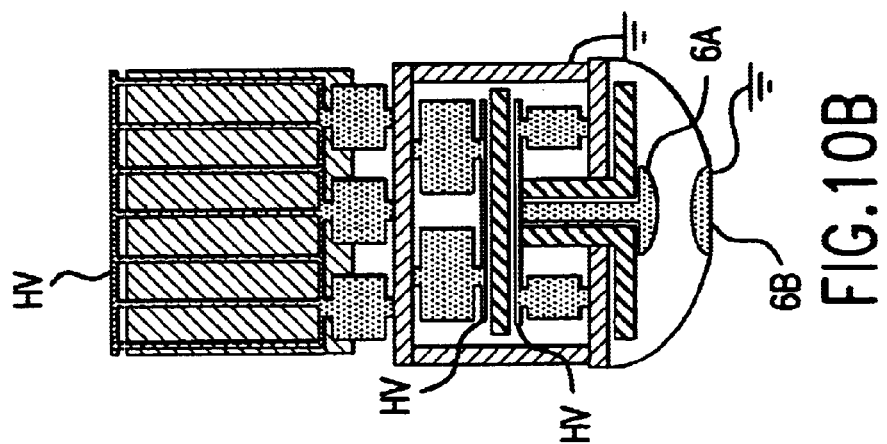
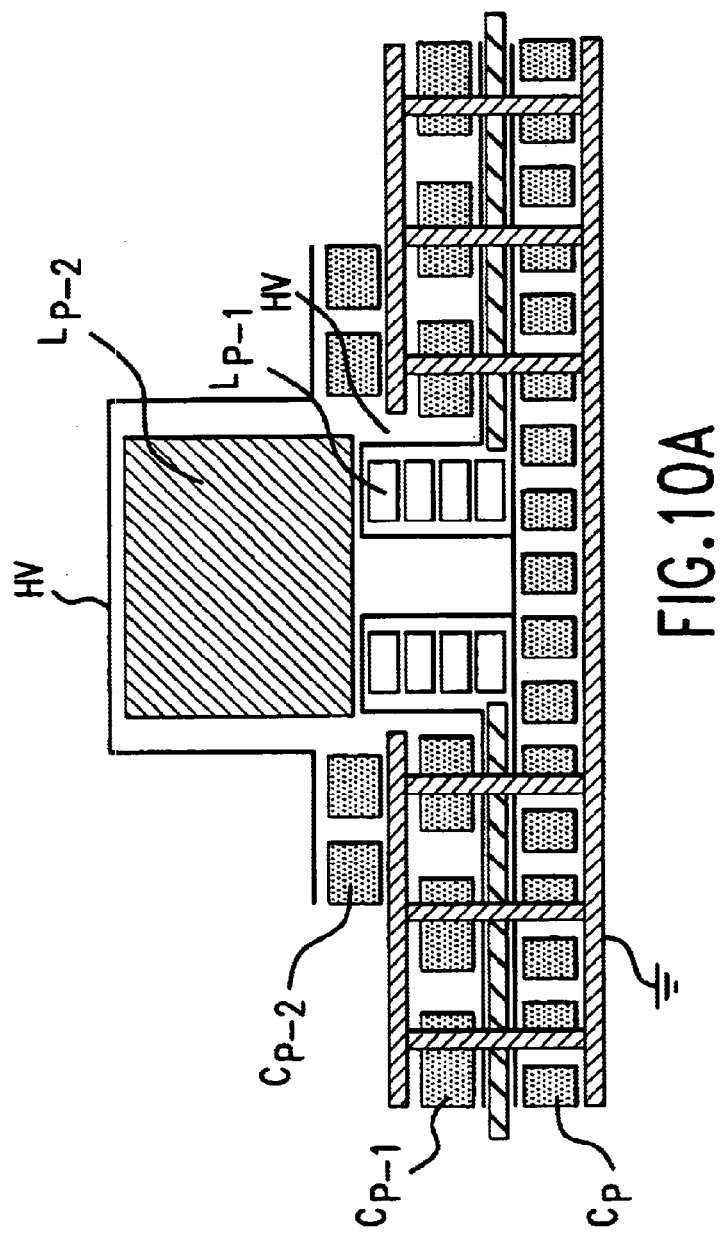
FIG.10A
FIG.10B

LONG-PULSE PULSE POWER SYSTEM FOR GAS DISCHARGE LASER

This invention is a Continuation-In-Part of Ser. No. 09/273,446, "Reliable, Modular, Production Quality Narrow-Band High Rep Rate $F_2$ Excimer Laser", filed Mar. 19, 1999. This invention relates to pulse power systems for gas discharge lasers.

BACKGROUND OF THE INVENTION

Pulse Power Systems

Pulse power electrical systems are well known. One such system is described in U.S. Pat. No. 5,142,166 issued to Birx. That patent described a magnetic pulse compression circuit which shortens and amplifies an electrical pulse resulting from the discharge of a charge storing capacitor bank. The patent also describes a induction transformer for amplifying the pulse voltage.

Another pulse power circuit is described in U.S. Pat. No. 5,729,562 issued to Birx, et al. which describes a pulse power system for a gas discharge laser and includes an energy recovery circuit for recovering electrical energy reflected from the laser electrodes.

Gas Discharge Lithography Lasers

Gas discharge lasers are well known and many of these lasers utilize pulse power systems such as those described in the two above-referenced patents to provide short high-voltage electrical pulses across the electrodes of the lasers. One such gas discharge laser is described in U.S. Pat. No. 4,959,840.

Lasers similar to the one described in U.S. Pat. No. 4,959,840 utilizing pulse power systems like the one described in U.S. Pat. No. 5,729,562 are utilized as light sources for integrated circuit lithography. At the present time, most of these lasers are configured to operate as KrF lasers utilizing a laser gas comprised of about 0.1 percent fluorine, about 1.0 percent krypton and the rest neon. These lasers produce light at a wavelength of about 248 nm.

There is a need for lithography light sources at wavelengths shorter than 248 nm such as that produced when the lasers are configured to operate as ArF or $F_2$ gas discharge lasers which produce laser beams with wavelengths of about 193 nm and about 157 nm, respectively. In the case of the ArF laser the gas mixture is substantially argon, fluorine and neon and in the case of the $F_2$ laser the gas mixture is substantially $F_2$ and He or $F_2$ and neon.

Optical Damage

Fused silica is the primary refractive optical material used in integrated circuit lithography devices. At wavelengths in the range of 193 nm and 157 nm fused silica is damaged by high intensity ultraviolet radiation. The damage is caused primarily by double photon excitation so that for a given pulse energy, the extent of the damage is determined largely by the shape and duration of the pulse.

Modular Pulse Power System

An electrical drawing of a prior art modular pulse power system is shown in FIG. 1. In a prior art system the components of the pulse power system are provided in a power supply module, a commutator module and a unit called the compression head which is mounted on the laser chamber.

High Voltage Power Supply Module

High voltage power supply module 20 comprises a 300-volt rectifier 22 for converting 208-volt three phase plant power from source 10 to 300-volt DC. Inverter 24 converts the output of rectifier 22 to high frequency 300 volt pulses in the range 1000 kHz to 2000 kHz. The frequency and the on period of inverter 24 are controlled by a HV power supply control board (not shown) in order to provide course regulation of the ultimate output pulse energy of the system. The output of inverter 24 is stepped up to about 1200 volts in step-up transformer 26. The output of transformer 26 is converted to 1200 volts DC by rectifier 28 which includes a standard bridge rectifier circuit 30 and a filter capacitor 32. DC electrical energy from circuit 30 charges 8.1 $\mu F$ $C_o$ charging capacitor 42 in commutator module 40 as directed by the HV power supply control board which controls the operation of inverter 24. Set points within HV power supply control board are set by a laser system control board in a feedback system in order to provide desired laser pulse energy and dose energy (i.e., the total energy in a burst of pulses) control.

The electrical circuits in commutator 40 and compression head 60 merely serve to utilize the electrical energy stored on charging capacitor 42 by power supply module 20 to form at the rate of (for example) 2,000 times per second electrical pulses, to amplify the pulse voltage and to compress in time the duration of each pulse. As an example of this control, the power supply may be directed to charge charging capacitor 42 to precisely 700 volts which during the charging cycle is isolated from the down stream circuits by solid state switch 46. The electrical circuits in commutator 40 and compression head 60 will upon the closure of switch 46 very quickly and automatically convert the electrical energy stored on capacitor 42 into the precise electrical discharge pulse across electrodes 83 and 84 needed to provide the next laser pulse at the precise energy needed as determined by a computer processor in the laser system.

Commutator Module

Commutator module 40 comprises $C_o$ charging capacitor 42, which in this embodiment is a bank of capacitors connected in parallel to provide a total capacitance of 8.1 $\mu F$. Voltage divider 44 provides a feedback voltage signal to the RV power supply control board 21 which is used by control board 21 to limit the charging of capacitor 42 to the voltage (called the "control voltage") which when formed into an electrical pulse and compressed and amplified in commutator 40 and further compressed in compression head 60 will produce the desired discharge voltage on peaking capacitor 82 and across electrodes 83 and 84.

In this embodiment (designed to provide electrical pulses in the range of about 3 Joules and 16,000 volts at a pulse rate of 1000 Hz to 2000 Hz, about 100 microseconds are required for power supply 20 to charge the charging capacitor 42 to 800 volts. Therefore, charging capacitor 42 is fully charged and stable at the desired voltage when a signal from commutator control board 41 closes solid state switch 44 which initiates the very fast step of converting the 3 Joules of electrical energy stored on charging capacitor $C_o$ into a 16,000 volt discharge across electrodes 83 and 84. For this embodiment, solid state switch 46 is a IGBT switch, although other switch technologies such as SCRS, GTOs, MCTs, etc. could also be used. A 600 nH charging inductor 48 is in series with solid state switch 46 to temporarily limit the current through switch 46 while it closes to discharge the $C_o$ charging capacitor 42.

The first stage of high voltage pulse power production is the pulse generation stage. To generate the pulse the charge on charging capacitor 42 is switched onto $C_1$ 8.5 µF capacitor 52 in about 5 µs by closing IGBT switch 46.

A saturable inductor 54 initially holds off the voltage stored on capacitor 52 and then becomes saturated allowing the transfer of charge from capacitor 52 through 1:23 step up pulse transformer 56 to $C_{p-1}$ capacitor 62 in a transfer time period of about 550 ns for a first stage of compression.

Pulse transformer 50 is similar to the pulse transformer described in U.S. Pat. Nos. 5,448,580 and 5,313,481; however, this prior art embodiment has only a single turn in the secondary and 23 separate primary windings to provide 1 to 23 amplification. Pulse transformer 50 is extremely efficient transforming a 700 volt 17,500 ampere 550 ns pulse rate into a 16,100 volt, 760 ampere 550 ns pulse which is stored very temporarily on $C_{p-1}$ capacitor bank 62 in compression head module 60.

Compression Head Module

Compression head module 60 further compresses the pulse.

An $L_{p-1}$ saturable inductor 64 (with about 125 nH saturated inductance) holds off the voltage on 16.5 nF $C_{p-1}$ capacitor bank 62 for approximately 550 ns then allows the charge on $C_{p-1}$ to flow (in about 100 ns) onto 16.5 nF Cp peaking capacitor 82 located on the top of laser chamber 80 and is electrically connected in parallel with electrodes 83 and 84 and preionizer 56A. This transformation of a 550 ns long pulse into a 100 ns long pulse to charge Cp peaking capacitor 82 makes up the second and last stage of compression.

Laser Chamber

About 100 ns after the charge begins flowing onto peaking capacitor 82 mounted on top of and as a part of the laser chamber module 80, the voltage on peaking capacitor 82 has reached about 14,000 volts and discharge between the electrodes begins. The discharge lasts about 50 ns during which time lasing occurs within the optical resonance chamber of the excimer laser. The optical resonance chamber described is defined by a line narrowing package comprised in this example of a 3-prism beam expander, a tuning mirror and an echelle grating and an output coupler.

Prior Art Pulse Shape and $T_{is}$

A typical pulse shape (power vs. time) of a prior art ArF laser with a pulse power system as shown in FIG. 1 is shown in FIG. 2. In this example the power rises fast from zero to a first peak in about 5 ns, fluctuates for about 20 ns then decreases to almost zero in about 10 ns. The total energy in the pulse is about 10 mJ. In order to minimize two-photon reactions, without reducing pulse energy, peaks should be reduced and the duration of the pulse should be lengthened. A parameter which is utilized in the lithography industry to evaluate the potential of these pulses to cause optical damage is called the "integral square pulse duration" and its symbol is $T_{is}$. $T_{is}$ is defined as follows:

$$T_{is} = \frac{\int (P(t)dt)^2}{\int P^2(t)dt}$$

where P=power $T_{is}$ for the pulse shown in FIG. 2 is about 35 ns.

The optical pulse duration of the laser is determined by the discharge current duration and by the discharge stability time, which is a function of the fluorine concentration. The current durations of a standard laser is given by:

$$\tau = \pi \cdot v \cdot \sqrt{LC}$$

L laser head inductance, C peaking capacitance

Any change in L or C is not very effective since pulse duration only increases to the square root. In the interest of laser efficiency, the laser head inductance L cannot be increased. Increasing the capacitance C slows down the voltage risetime and significantly increases the amount of energy deposited into the discharge. Both measures deteriorate the discharge quality and efficiency. Therefore a doubling of the pulse duration will not be possible with a simple LC circuit.

Long pulse duration excimers lasers have been built using so-called spiker-sustainer excitation. In this scheme the tasks of reaching gas break-down and sustaining a stable discharge have been divided into two separate systems. Gas break down requires high voltages but only low energies, which is handled by a spiker circuit. A sustainer circuit is matched to the much lower steady state discharge voltage and provides the pumping of the laser. Because the voltage of the sustainer is much lower, a larger capacitance can be used and much longer pulse duration are achievable. In XeCl laser pulse durations up to 1.5 ns have been realized using spiker-sustainer excitation.

Unfortunately, spiker-sustainer circuits are not applicable to lithography lasers. KrF and ArF discharges use $F_2$ as the halogen donor, which makes discharges inherently more unstable and limits the pulse duration with respect to chlorine based lasers. More importantly, spiker-sustainer excitation provides low gain due to the stretched out power deposition. Lithography lasers require line-narrowing provisions that typically introduce high cavity losses. In such a configuration, the low gain can barely overcome the losses and low laser performance results.

What is needed is a pulse power system for lithography lasers which will provide a substantial increase in $T_{is}$ from about 30–35 ns to about 50–60 ns.

SUMMARY OF THE INVENTION

The present invention provides a long pulse pulse power system for gas discharge lasers. The system includes a sustainer capacitor for accepting a charge from a high voltage pulse power source. A peaking capacitor with a capacitance value of less than half the sustainer capacitance provides the high voltage for the laser discharge.

BRIEF DESCRIPTION OF THE DRAWINGS

FIGS. 10A and 10B show components of the present invention.

DETAILED DESCRIPTION OF PREFERRED EMBODIMENTS

First Preferred Embodiment

Figure 1:
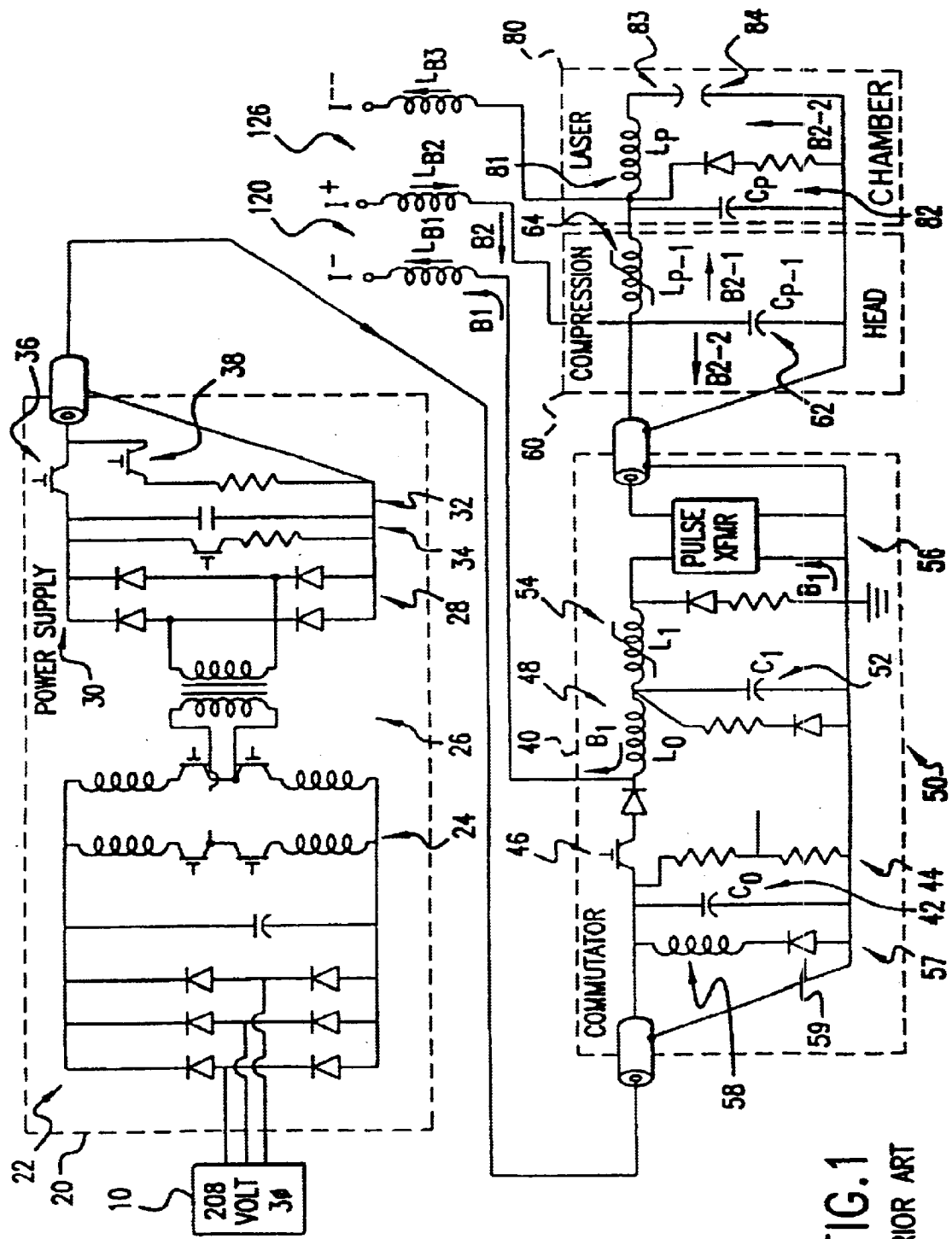
FIG. 1 is a drawing showing the electrical components of a prior art pulse power system.
Figure 2:
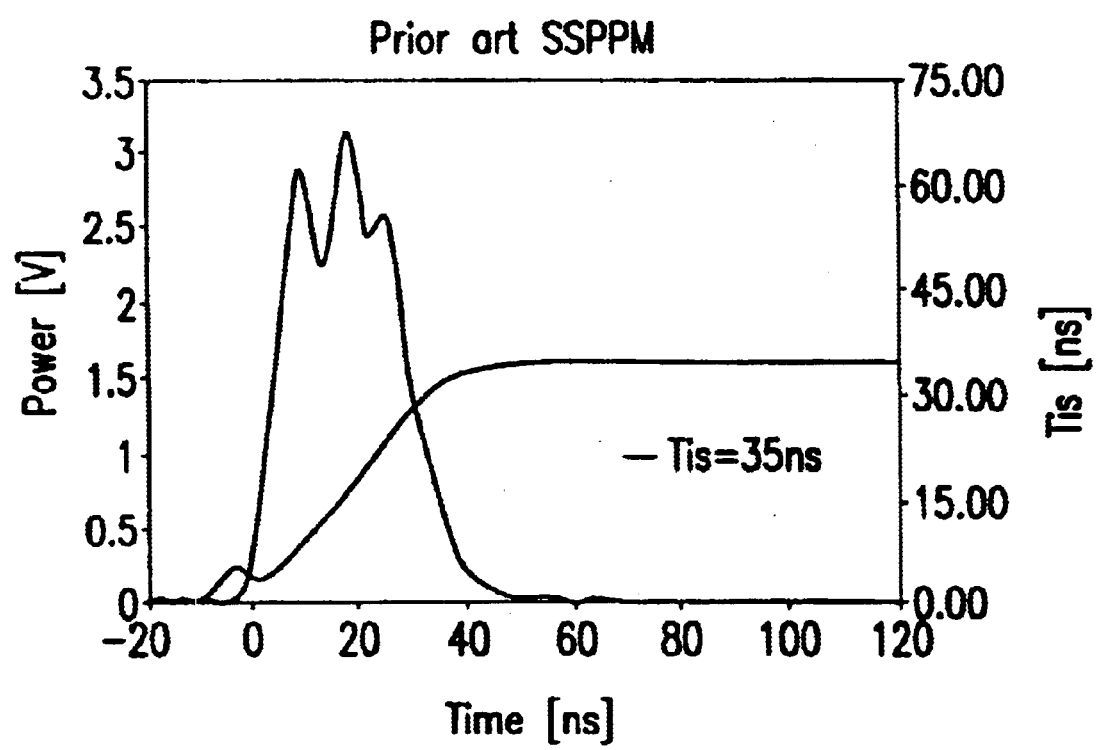
FIG. 2 is a chart showing a prior art waveform.
Figure 3:
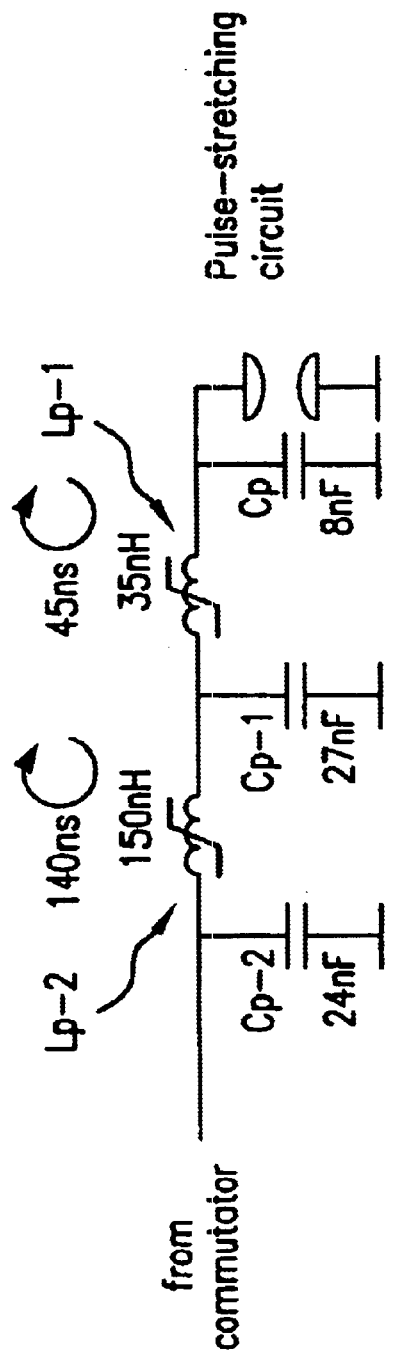
FIG. 3 is a drawing showing a preferred embodiment of the present invention.
Figure 4:
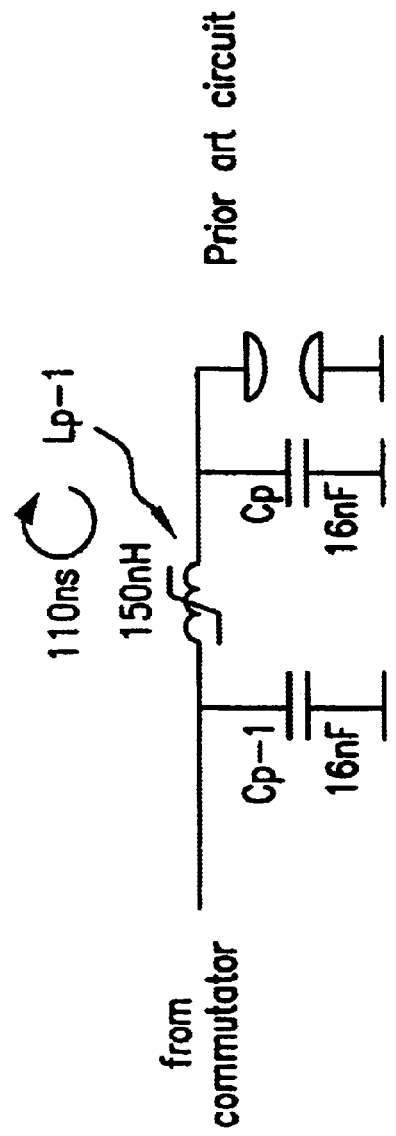
FIG. 4 is a drawing showing the components of a prior art system replaced by the components of FIG. 3.

A first preferred embodiment of the present invention can be described by reference to FIG. 3. This embodiment is exactly the same as the system described in FIG. 1 through pulse transformer 56. The improvements of the present invention can be described by comparing FIG. 3 to FIG. 2 which shows the main components of the prior art pulse power system of FIG. 1 which are downstream of the pulse transformer.

In this embodiment, long pulses are generated by means of a double pulse excitation circuit. The individual pulses have high gain to allow line-narrowing and are timed in close succession to act as a single pulse. The basic circuit is a variation of the spiker-sustainer circuit. However, the energy stored in the spiker circuit is increased sufficiently to generate a spiker lasing pulse. The second pulse is generated by the sustainer circuit, with a time constant reduced to provide higher gain relative to classical sustainer circuits. The circuits are balanced to provide roughly equal energy in both pulses, which also maximizes the integral square value $\tau_{is}$ for the pulse. In the presented implementation, the spiker and sustainer circuits are not independent systems but are closely coupled. This greatly reduces system complexity and eliminates the need to synchronize the two systems.

The sustainer capacitor $C_{p-1}$ with a capacitance of 27 nF is pulse-charged in about 120 ns through feeder saturable inductor LP-2 from feeder capacitor $C_{p-2}$ at 24 nF. During this time the spiker or peaking capacitor $C_p$ is isolated by the saturable inductor $L_{p-1}$. At the end of $C_{p-1}$ charging, inductor $L_{p-1}$ changes to a low inductance state and capacitor $C_p$ at 8 nF is being resonantly charged. Because $C_p$ is much smaller than $C_{p-1}$ the voltage on $C_p$ will ring up to a higher value. The maximum voltage gain can reach a factor of two and is given by:

$$V_{C_p} = \frac{2}{1 + \frac{C_p}{C_{p-1}}} - V_{C_{pI}}$$

but in the embodiment $V_{Cp}=1.5\ V_{Cp-1}$.

In this way it is possible to generate a high spiker voltage without the need for separate high and medium voltage systems. In addition the small value of $C_p$ results in a fast voltage risetime, which aids in the initiation of stable discharge.

The high voltage on $C_p$ will break down the laser gas and generate the first laser pulse. Once $C_p$ is depleted the discharge current will be sustained by $C_{p-1}$ and a second laser pulse is generated. In a properly adjusted system the energy on $C_p$ and $C_{p-1}$ at the instant of gas break down will be roughly equal, to ensure laser pulses of equal size.

Figure 5:
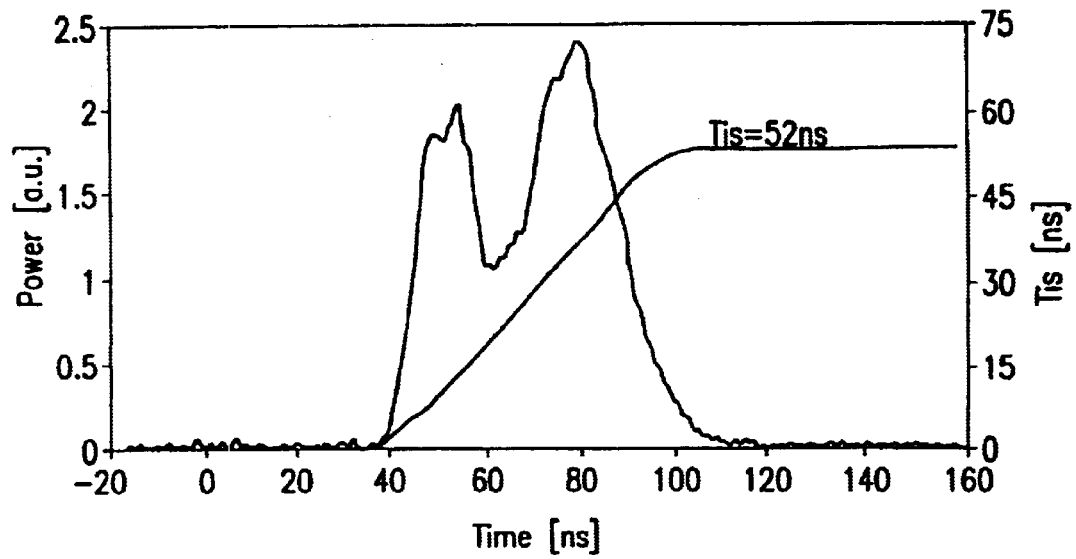
FIG. 5 shows the waveform of the present invention.
Figure 6:
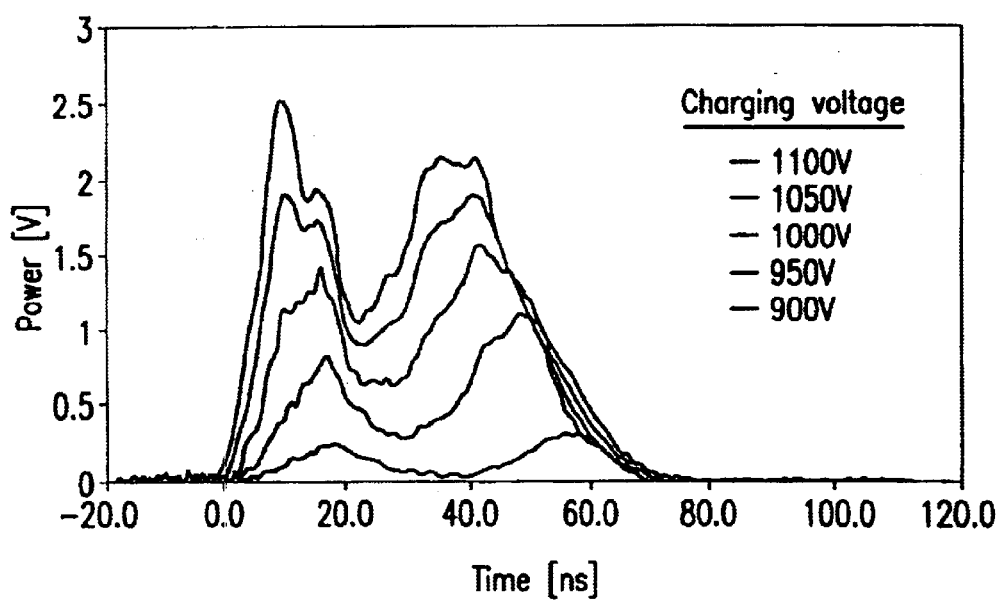
FIG. 6 shows a family of waveforms at a variety of charging voltages.
Figure 7:
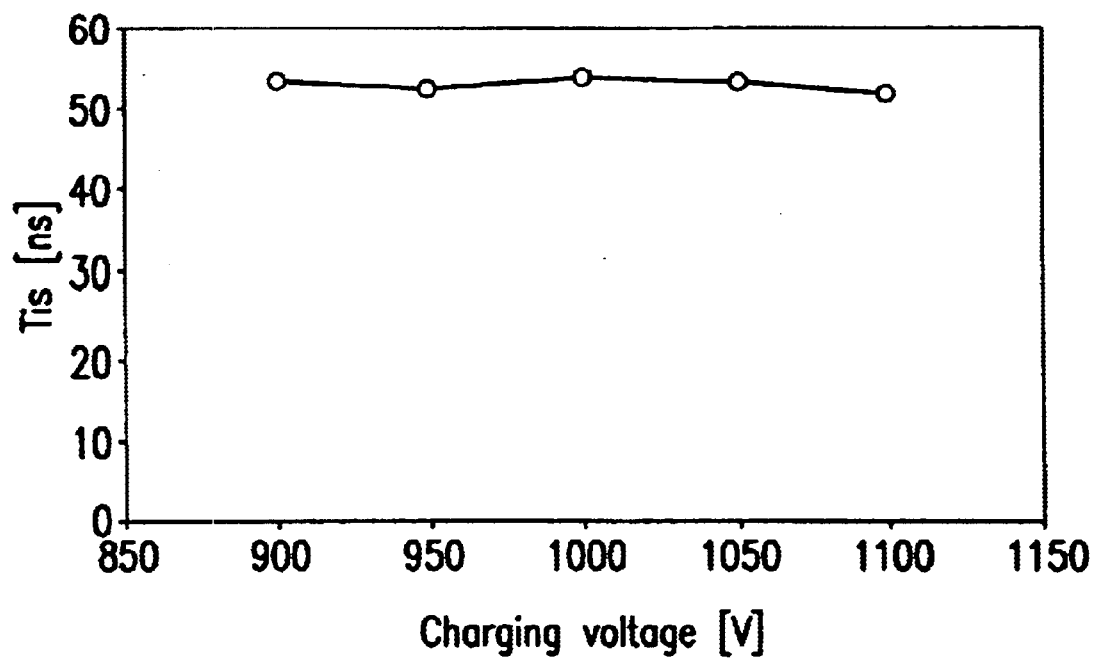
FIG. 7 shows the variation of $T_{is}$ with charging voltage.

The temporal shape of a line-narrowed ArF laser pulse of 10 mJ energy is displayed in FIG. 5. Also indicated is the integral square duration for this pulse. These curves can be compared with the corresponding prior art curves shown in FIG. 2. During the life of a lithography laser chamber, the laser will be operated at a large range of charging voltages. It is important that the minimum pulse duration can be maintained over the entire operating range. The pulse shape and the corresponding integral square durations for charging voltages ranging from 850V to 1100V is shown in FIGS. 6 and 7, respectively. The pulse shapes are a function of charging voltage, but the integral square duration is largely unaffected and maintains a value larger than 50 ns.

Figure 8:
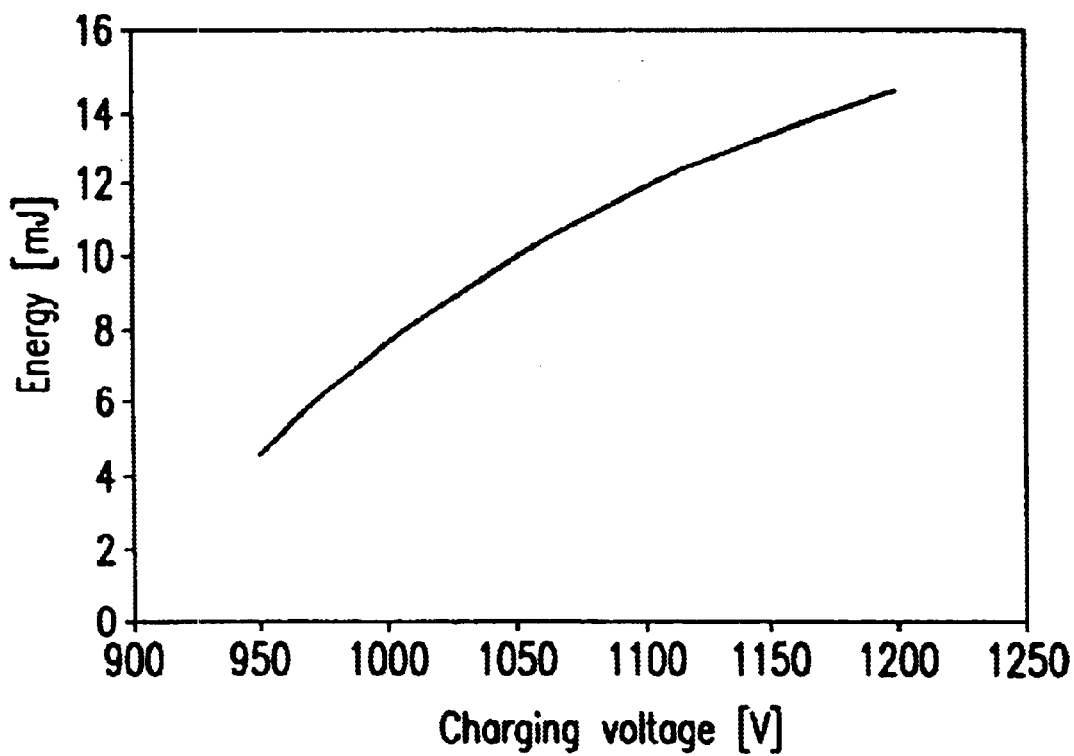
FIG. 8 shows the variation of pulse energy with charging voltage.

The pulse energy as a function of charging voltage is displayed in FIG. 8. There is a direct relationship with minimum roll-off between pulse energy and voltage. This is important for energy algorithms to work properly and to maintain a stable energy dose for wafer exposure. The maximum energy is 14 mJ which provides sufficient lifetime overhead for a nominal 5 mJ laser.

Figure 11:
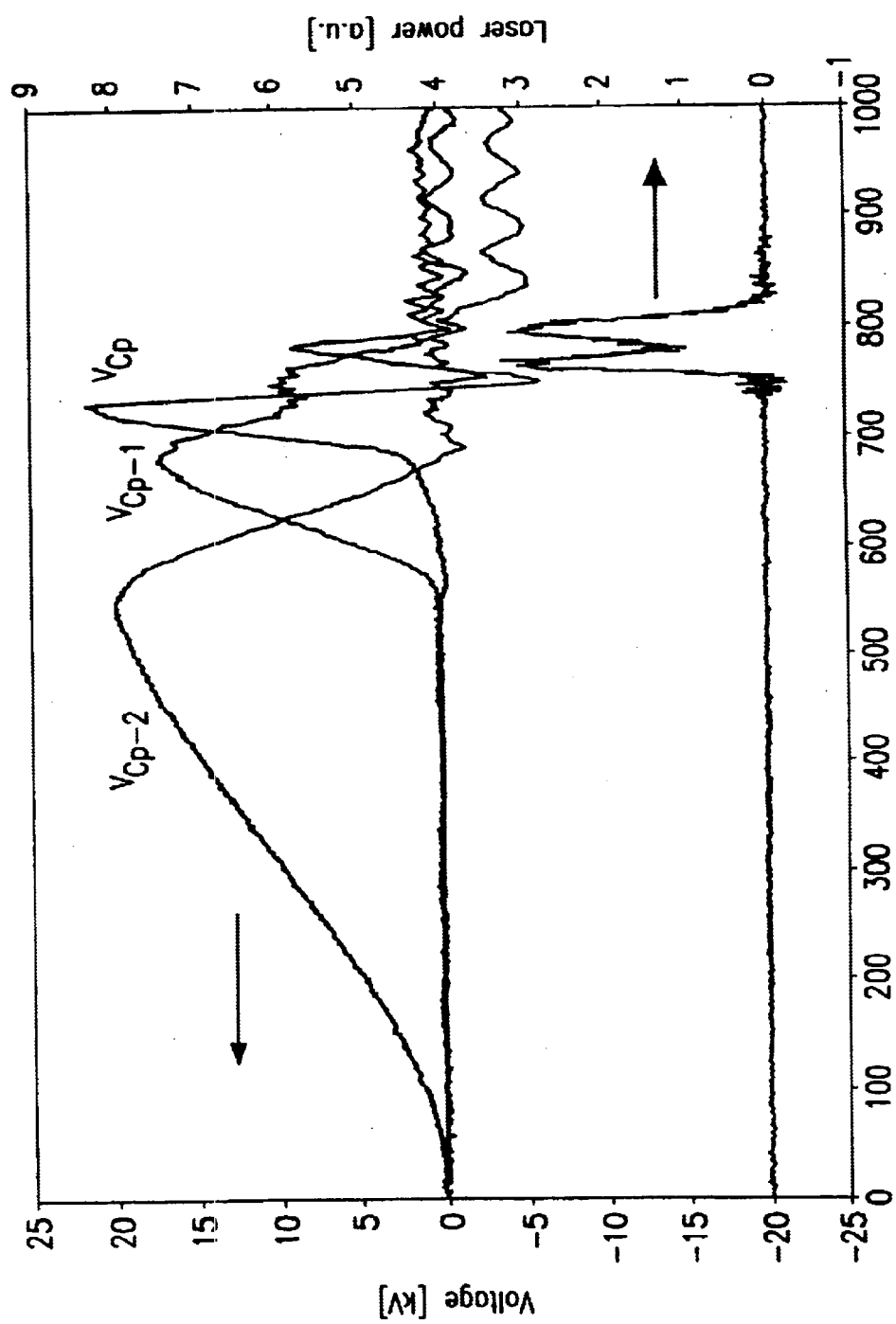
FIG. 11 shows waveforms of the voltage potential on three capacitors of the FIGS. 10A and 10B embodiment and the laser power waveform.

FIG. 11 shows voltage traces of the charges on $C_{p-2}$, $C_{p-1}$ and $C_p$ along with a trace of the pulse power. As shown in the laser power trace, the two peaks of the pulse are almost equal.

Physical modifications to the prior art pulse power system downstream of pulse transformer 56 can be described by comparing FIGS. 9A, 9B, 10A and 10B.

Figure 9B:
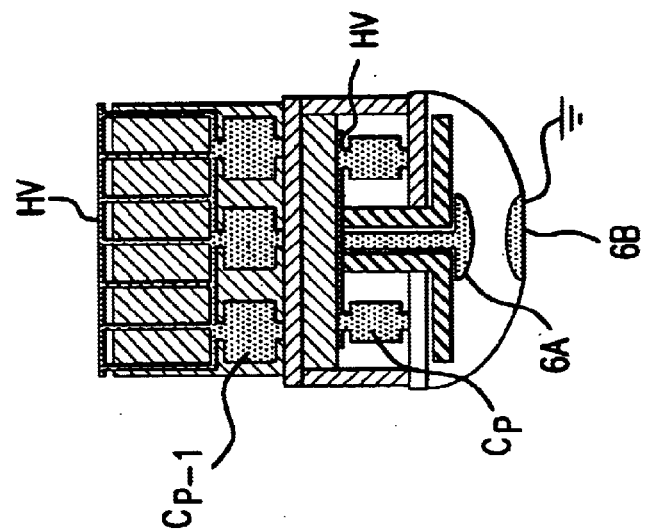
FIG. 9A a prior art configuration.
Figure 9A:
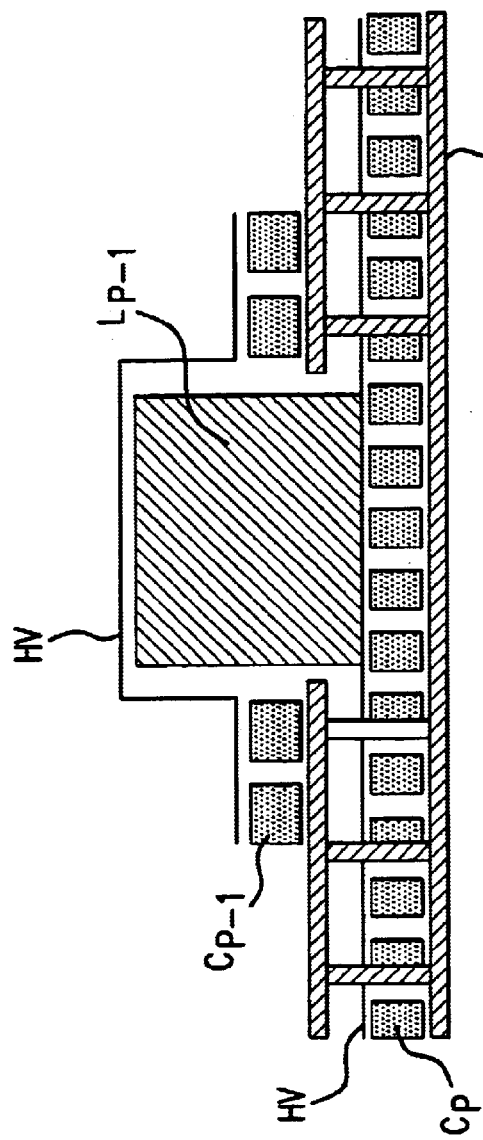

FIGS. 9A and 9B show the prior art arrangement. These drawings show $C_{p-1}$ 16 nF capacitor bank, $L_{p-1}$ saturable inductor which in this embodiment has a saturated inductance of 150 nH, and $C_p$ 16 nF capacitor bank. FIG. 9B also shows cathode 6A and anode 6B which is connected to ground. Ground structures and high voltage HV buses are also indicated.

FIGS. 10A and 10B show the modifications to provide the first embodiment of the present invention. In this embodiment $L_{p-2}$ is equivalent to $L_{p-1}$ in the FIGS. 9A and 9B system $C_{p-2}$ is arranged in a similar fashion to $C_{p-1}$ in the FIGS. 9A and 9B system. The additional capacitor bank $C_{p-1}$ and the additional saturable inductor $L_{p-1}$ are sandwiched in as shown in the figures. High voltage buses and ground structures are indicated as are electrodes 6A and 6B.

While the present invention has been described in the content of a specific embodiment, persons skilled in the laser art will recognize many variations which are possible. For example, capacitor $C_{p-2}$ and inductor $L_{p-2}$ shown in FIG. 3 could be eliminated which would make the system less costly but there would be more leakage current and the circuit designed has less control over the resulting waveforms.

Figure 12A:
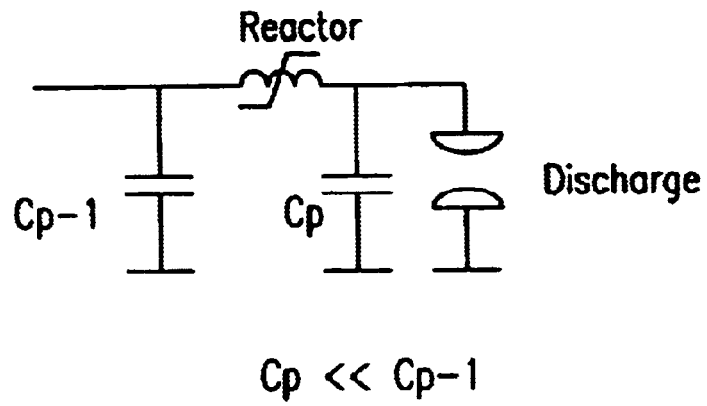
FIGS. 12A and 12B show a "poor man's" spiker sustainer circuit.
Figure 12B:
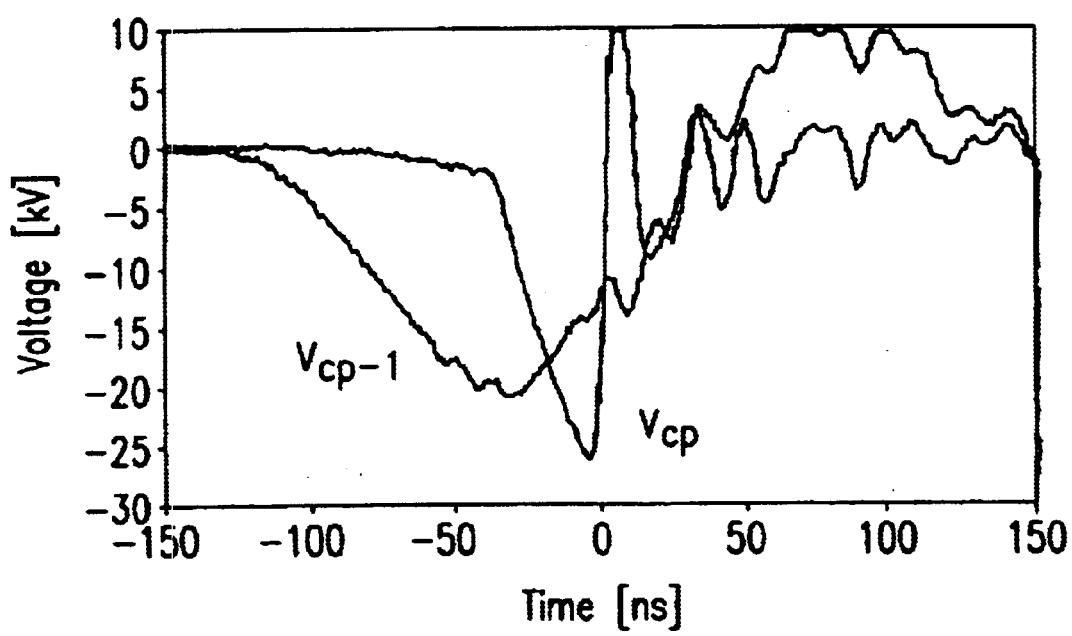

Applicants call this circuit the Poor Man's Spiker Sustainer Circuit. The circuit and an example of the waveform are shown in FIGS. 12A and 12B. Therefore, the reader should understand that the scope of the invention is to be determined by the appended claims and their legal equivalents.

What is claimed is:

1. A gas discharge laser system comprising:
   A) a laser chamber comprising a pair of electrodes and a circulating laser gas,
   B) a high voltage pulse power source means for providing high voltage pulses of electrical power,
   C) a sustainer capacitor defining a sustainer capacitance for accepting charge from said high voltage pulse power source,
   D) a peaking capacitor for accepting a charge from said sustainer capacitor and for applying a high voltage potential across said electrodes to cause an electrical discharge,
   E) a sustainer saturable inductor electrically positioned between said sustainer capacitor and said peaking capacitor,
wherein said peaking capacitor has a capacitance value of less than one half of said sustainer capacitance.

2. A system as in claim 1 wherein the high voltage power source comprises a high voltage pulse power supply for converting plant AC power to a DC power for charging a charging capacitor, a magnetic compression circuit for producing an electrical pulse having a peak voltage, a solid state switch for discharging said charging capacitor into said magnetic compression circuit and a pulse transformer for amplifying said peak voltage to produce said high voltage pulses.

3. A system as in claim 1 wherein said peaking capacitor has a capacitance value of less than ⅓ of said sustaining capacitance.

4. A system as in claim 1 and further comprising a feeder capacitor and a feeder saturable inductor said feeder capacitor configured to rapidly feed current to said sustainer capacitor through said feeder saturable inductor.

5. An argon-fluoride excimer laser system comprising:
A) a laser chamber comprising a pair of electrodes and a circulating laser gas comprising argon, fluorine and a noble buffer gas,
B) a high voltage pulse power source means for providing high voltage pulses of electrical power,
C) a sustainer capacitor defining a sustainer capacitance for accepting charge from said high voltage pulse power source,
D) a peaking capacitor for accepting a charge from said sustainer capacitor and for applying a high voltage potential across said electrodes to cause an electrical discharge,
E) a sustainer saturable inductor electrically positioned between said sustainer capacitor and said peaking capacitor,
wherein said peaking capacitor has a capacitance value of less than one half of said sustainer capacitance.

6. A system as in claim 5 wherein the high voltage power source comprises a high voltage pulse power supply for converting plant AC power to a DC power for charging a charging capacitor, a magnetic compression circuit for producing an electrical pulse having a peak voltage, a solid state switch for discharging said charging capacitor into said magnetic compression circuit and a pulse transformer for amplifying said peak voltage to produce said high voltage pulses.

7. A system as in claim 5 wherein said peaking capacitor has a capacitance value of less than ⅓ of said sustaining capacitance.

8. A system as in claim 5 and further comprising a feeder capacitor and a feeder saturable inductor said feeder capacitor configured to rapidly feed current to said sustainer capacitor through said feeder saturable inductor.

9. A gas discharge laser system comprising:
A) a laser chamber comprising a pair of electrodes and a circulating laser gas,
B) a high voltage pulse power source means for providing high voltage pulse of electrical power,
C) a sustainer capacitor defining a sustainer capacitance for accepting charge from said high voltage pulse power source,
D) a peaking capacitor for accepting a charge from said sustainer capacitor and for applying a high voltage potential across said electrodes to cause an electrical discharge,
E) a sustainer saturable inductor electrically positioned between said sustainer capacitor and said peaking capacitor,
wherein said sustainer capacitance and the capacitance of said peaking Capacitor are selected to provide a second discharge voltage across said electrodes after the application of the high voltage potential across said electrodes by said peaking capacitor.

10. A system as in claim 9 wherein the high voltage power source comprises a high voltage pulse power supply for converting plant AC power to a DC power for charging a charging capacitor, a magnetic compression circuit for producing an electrical pulse having a peak voltage, a solid state switch for discharging said charging capacitor into said magnetic compression circuit and a pulse transformer for amplifying said peak voltage to produce said high voltage pulses.

11. A system as in claim 9 wherein said peaking capacitor has a capacitance value of less than ⅓ of said sustaining capacitance.

12. A system as in claim 9 and further comprising a feeder capacitor and a feeder saturable inductor said feeder capacitor configured to rapidly feet current to said sustainer capacitor through said feeder saturable inductor.

13. A system as in claim 9 wherein said laser comprises argon, fluorine and a noble buffer gas.

14. An argon-fluoride excimer laser system comprising:
A) a laser chamber comprising a pair of electrodes and a circulating laser gas comprising argon, fluorine and a noble buffer gas,
B) a high voltage pulse power source means for providing high voltage pulses of electrical power,
C) a sustainer capacitor defining a sustainer capacitance for accepting charge from said high voltage pulse power source,
D) a peaking capacitor for accepting a charge from said sustainer capacitor and for applying a high voltage potential across said electrodes to cause an electrical discharge,
E) a sustainer saturable inductor electrically positioned between said sustainer capacitor and said peaking capacitor,
wherein said sustainer capacitance and the capacitance of said peaking capacitor are selected to provide a second discharge voltage across said electrodes after the application of the high voltage potential across said electrodes by said peaking capacitor.

15. A A system as in claim 14 wherein the high voltage power source comprises a high voltage pulse power supply for converting plant AC power to a DC power for charging a charging capacitor, a magnetic compression circuit for producing an electrical pulse having a peak voltage, a solid state switch for discharging said charging capacitor into said magnetic compression circuit and a pulse transformer for applying said peak voltage to produce said high voltage pulses.

16. A system as in claim 14 wherein said peaking capacitor has a capacitance value of less than ⅓ of said sustaining capacitance.

17. A system as in claim 14 and further comprising a feeder capacitor and a feeder saturable inductor said feeder capacitor configured to rapidly feed current to said sustainer capacitor through said feeder saturable inductor.

\* \* \* \* \*